United States Patent [19]

Rubinstein

[11] Patent Number: 5,305,255
[45] Date of Patent: Apr. 19, 1994

[54] NON-DESTRUCTIVE READOUT FERROELECTRIC MEMORY CELL

[75] Inventor: Tzvi Rubinstein, Sharon, Mass.

[73] Assignee: Raytheon Company, Lexington, Mass.

[21] Appl. No.: 451,700

[22] Filed: Dec. 18, 1989

[51] Int. Cl.$^5$ ............................................. G11C 11/22
[52] U.S. Cl. .................................. 365/145; 365/154; 365/222
[58] Field of Search ............ 365/145, 149, 154, 225.6, 365/222

[56] References Cited

U.S. PATENT DOCUMENTS 4,873,664 10/1989 Eaton, Jr. ............................. 365/145

Primary Examiner—David C. Cain
Attorney, Agent, or Firm—R. M. Sharkansky

[57] ABSTRACT

A non-volatile ferroelectric memory with very slight disruption of the memory contents during a read operation. The ferroelectric capacitors are connected to the row and column control lines through transistor switches. Control logic senses the level of current flowing into the ferroelectric capacitor during a read operation. If the current flow exceeds a threshold, the transistor switches are activated to reverse the polarity of the voltage applied to the ferroelectric capacitor.

17 Claims, 2 Drawing Sheets

NON-DESTRUCTIVE READOUT FERROELECTRIC MEMORY CELL

The Government has rights in this invention pursuant to Contract No. N00030-89-C-0020 awarded by the Department of the Navy.

BACKGROUND OF THE INVENTION

This invention relates generally to integrated circuit memories and more specifically to non-volatile memories.

Semiconductor memories are widely used in computer systems and come in many varieties. Non-volatile memories represent one important type of memory. These memories continue to store information even if power to the memory is turned off or otherwise interrupted.

Ferroelectric material has recently been used to make non-volatile memories. These non-volatile memories typically contain an array of cells containing ferroelectric capacitors. These cells are accessed by a grid of row and column lines since each cell is connected between one row and one column line. By applying a voltage between one row and one column line, one cell is uniquely addressed and the applied voltage appears across the addressed cell.

The addressed ferroelectric cell acts like a capacitor and charges up to the applied voltage. Unlike a capacitor, though, the cell keeps it charge even after the applied voltage is removed. In this way, the memory can store information when no voltage is applied to the memory. To store a logic one, a cell is charged to a first voltage. To store a logic zero, a cell is charged to a second voltage. The second voltage usually has the same magnitude as the first voltage but is of opposite polarity.

Information is read from a cell in a destructive read operation. As part of the read operation, voltage which is sufficient to store a logic one in a cell is applied to the cell. The amount of current flowing through the cell while this voltage is applied indicates the value previously stored in the cell. A relatively high current flow indicates the cell changed from storing a logic zero to storing a logic one. A relatively low level of current flow indicates the cell previously stored a logic one. Thus, the state of the cell is sensed by measuring the current flow when the reading voltage is applied.

After the sense portion of the read operation, the cell will always store a logic one. If the cell contained a logic zero which is changed to a logic one during a read, the previous value stored in the cell must be restored. To achieve this result, logic circuitry built into the memory initiates a write operation to write a logic zero into the accessed cell.

Destructive read out suffers from two shortcomings. First, it can take up to two access cycles to read information from memory. In the first, the information is sensed. In the second cycle, the information is rewritten into the cell. This extra cycle can slow down operation of a ferroelectric memory.

A second shortcoming of a destructive readout is that the information in memory may be totally lost if the power to the memory is removed during the read operation. In particular, if power is lost after the contents of the cell are sensed but before the contents are rewritten, correct contents of the cell will never be restored. Since non-volatile memory is often used to store information which must be saved in the event of an unexpected power loss, this second shortcoming can present a significant problem.

SUMMARY OF THE INVENTION

With the foregoing background in mind, it is an object of this invention to provide a ferroelectric memory in which the value stored in a memory cell can be quickly read.

It is a further object of this invention to provide a memory in which the value stored in a memory cell can be sensed and restored so quickly that the value stored in the cell is disrupted for only a very short period of time.

The foregoing and other objects are achieved in a memory structure containing transistor switches between each ferroelectric memory element and the drive voltage sources used to write a value into the cell. The switches are normally in a first state, allowing normal write operations to occur. The polarity of the voltage across the accessed cell is set to the appropriate polarity by the drive voltage sources to write a one or a zero into the cell. At the start of a read operation, the switches are in the first state and the drive voltage sources impose a positive voltage across the cell. If a high level current flows, indicating the state of the cell changed as a result of the read operation, the state of the transistor switches changes to reverse the polarity of the voltage across the cell. In this way, the state of the cell is restored.

BRIEF DESCRIPTION OF THE DRAWINGS

The invention will be better understood by reference to the following more detailed description and accompanying drawings in which.

DETAILED DESCRIPTION OF THE PREFERRED EMBODIMENT

Figure 1:
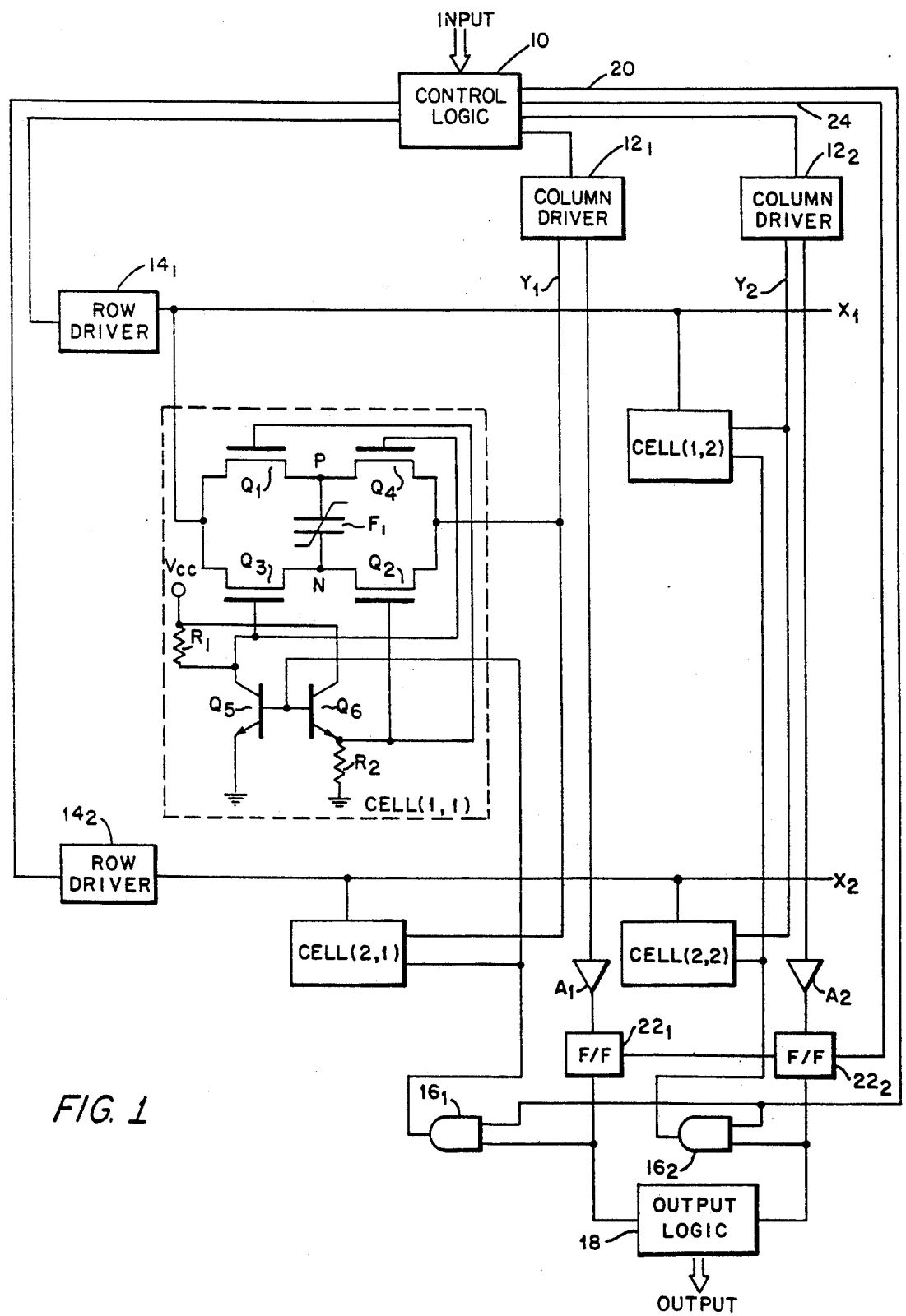
FIG. 1 is a simplified block diagram of a non-volatile memory constructed according to the invention.

FIG. 1 shows a simplified block diagram of a memory constructed according to the present invention. Such memories are often constructed on a single integrated circuit chip using well known fabrication techniques.

The memory contains an array of cells $(1, 1)$, $(2, 1)$, $(1, 2)$, $(2, 2)$. One of skill in the art will appreciate that a memory would likely contain many more cells. However, only four cells are shown here for clarity. In addition, only the details of cell $(1, 1)$ are shown. All other cells are constructed similarly.

Each of the memory cells $(1, 1) \ldots (2, 2)$ is connected to one of the row lines $X_1$ or $X_2$ and one of the column lines $Y_1$ or $Y_2$. To access, or "address", one cell, the row line and the column line to which that cell is connected are activated by the appropriate one of the row drivers $14_1$ or $14_2$ and the appropriate one of the column drivers $12_1$ or $12_2$. The voltages placed on the row lines $X_1$ and $X_2$ and the column lines $Y_1$ and $Y_2$ are dictated by control logic 10.

Here, control logic 10 functions like the control logic in a conventional memory. It receives inputs which dictate whether a read or write operation is to be performed and which cell is to be addressed. If information is to be written to a cell, the input also contains the value to be written. Control logic 10 decodes this information and controls the appropriate row and column drivers to set their corresponding lines to the supply voltage or to ground.

How the voltages on row and column lines can read or write information into a memory cell can be understood from the details of cell (1, 1). Cell (1, 1) contains a ferroelectric capacitor $F_1$. Ferroelectric capacitor $F_1$ consists of two conducting plates with ferroelectric material in between and is made in any known manner.

To write a logic 1 into cell (1, 1), row driver $14_1$ connects row line $X_1$ to ground and column driver $12_1$ connects column line $Y_1$ to the positive source $V_{CC}$. Transistors $Q_3$ and $Q_4$ conduct such that ferroelectric capacitor $F_1$ charges with a positive voltage with respect to the terminal marked N. To write a logic 0 to cell (1, 1), the polarity of the voltage across ferroelectric capacitor $F_1$ is inverted. This inversion results because row driver $14_1$ connects a positive voltage to row line $X_1$ and column driver $12_1$ connects column line $Y_1$ to ground.

Conduction of transistors $Q_3$ and $Q_4$ during a write operation can be traced to output 20 of control logic 10. During a write operation, line 20 is in a logic zero state. The output of AND gate $16_1$ must also be in a logic zero state. Therefore, the bases of transistors $Q_5$ and $Q_6$ are at a zero state and transistors $Q_5$ and $Q_6$ do not conduct current. Since no current flows through $Q_5$ and $Q_6$, no current flows through resistor $R_1$ and the gates of transistors $Q_3$ and $Q_4$ are at the positive supply potential $V_{CC}$.

To read the value stored in cell (1, 1), a voltage sufficient to write a logic one is applied to ferroelectric cell $F_1$. As described above, a logic one is written to the cell by having transistors $Q_3$ and $Q_4$ conduct and row line $X_1$ at ground and column $Y_1$ at $V_{CC}$. Transistors $Q_3$ and $Q_4$ conduct at the start of the read operation because of the outputs of control logic 10. Via line 24, control logic 10 resets the outputs of flip-flops $22_1$ and $22_2$ to the logic zero state. Even though line 20 is in a logic one state during a read operation, the output of AND gate $16_1$ is still a logic zero. As described previously, having a zero output from AND gate $16_1$ ensures that transistors $Q_3$ and $Q_4$ conduct.

If, before the read operation, ferroelectric capacitor $F_1$ was charged to the logic zero state, applying the logic one voltage will cause the capacitor $F_1$ to charge up to the logic one state. Charging capacitor $F_1$ necessarily requires a current flow through column driver $12_1$. Here, sense amplifier $A_1$ is connected to column driver $12_1$ to detect that current. If a current flow exceeding a threshold is detected, the output of sense amplifier $A_1$ goes to a logic one state.

A logic one on the output of sense amplifier $A_1$ will produce two results. First, it provides an indication to output logic 18 that the value stored in the cell being read is a logic zero. Output logic 18 outputs this information in a conventional manner. Second,, a high output of sense amplifier $A_1$ indicates the value stored in ferroelectric capacitor $F_1$ must be restored.

The restore portion of the read is initiated by a logic one at the output of sense amplifier $A_1$. Since line 20 is in a logic one state during a read, both inputs to AND gate $16_1$ are at a logic one and the output is at a logic one. As can be seen, a logic one at the output of AND gate $16_1$ causes transistors $Q_1$ and $Q_2$ to go into the conducting state. Transistors $Q_3$ and $Q_4$ 90 into the non-conducting state.

The change from having $Q_3$ and $Q_4$ conduct to having $Q_1$ and $Q_2$ conduct has the affect of switching the polarity of the voltage across ferroelectric capacitor $F_1$. The switch in polarity is apparent because the terminal P of ferroelectric capacitor $F_1$ is connected to row line $X_1$ at ground potential and the terminal N is connected to column line $Y_1$ at $V_{CC}$.

This switched polarity stays effective until the end of the read operation. At that time, control logic 10 sets line 20 back to a logic zero and resets flip-flop $22_1$. The output of AND gate $16_1$ goes to zero again. As a result, transistors $Q_3$ and $Q_4$ conduct and transistors $Q_1$ and $Q_2$ go back to a non-conducting state.

Figure 2:
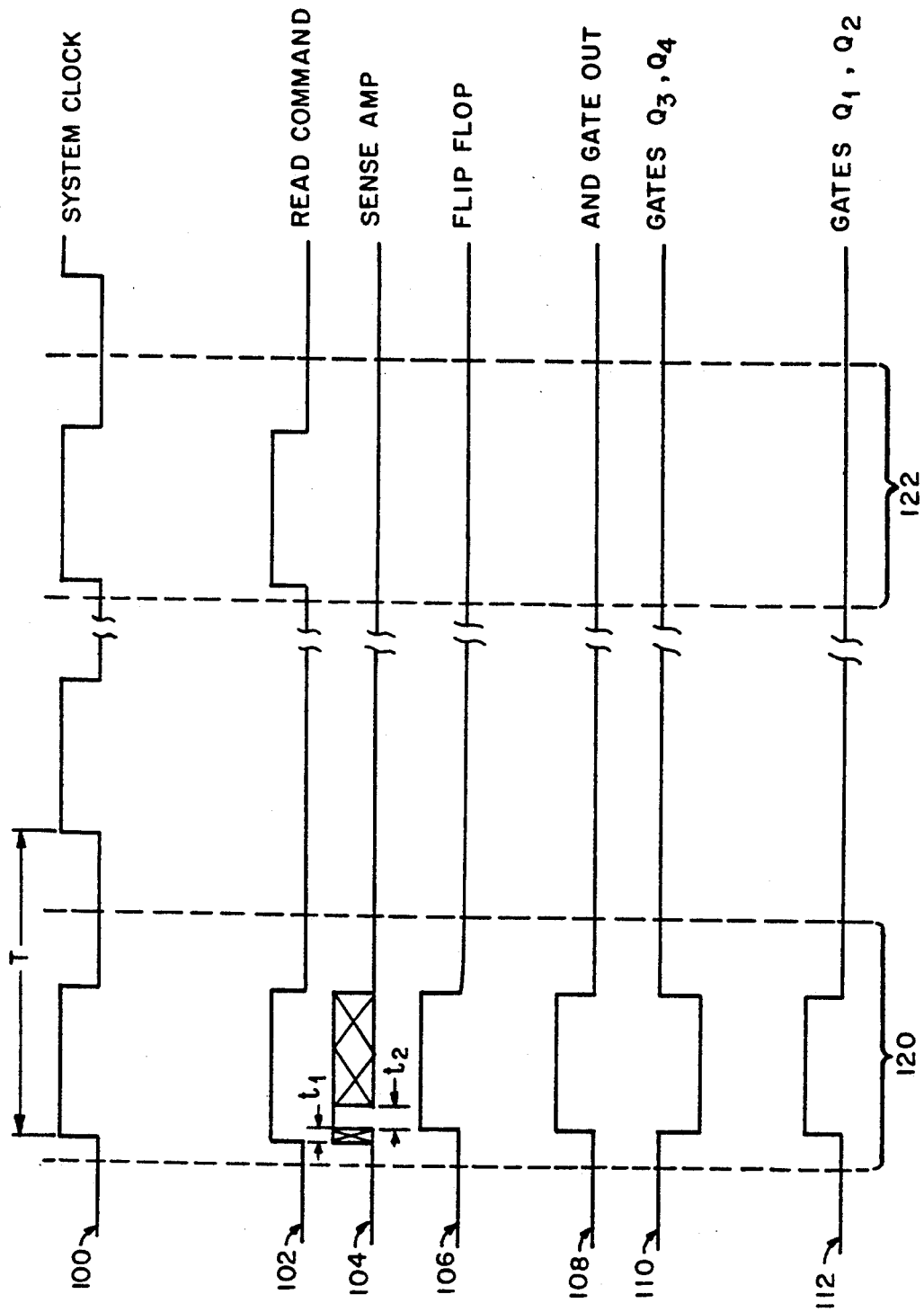
FIG. 2 is a timing diagram of the operation of the memory of FIG. 1.

The advantage of switching the polarity of the voltage on ferroelectric capacitor $F_1$ during the read may be appreciated by an examination of FIG. 2. FIG. 2 shows a timing diagram of the memory of FIG. 1. Timeline 100 is the system clock. Timeline 102 depicts the values on line 20. Here, line 20 goes high during cycles 120 and 122, indicating two read operations.

Cycle 120 depicts a read operation where a zero is read from memory. Therefore, the output of sense amplifier $A_1$, as shown on line 104, initially goes high during the read. The output of flip-flop $22_1$, as shown on line 106, follows the output of sense amplifier $A_1$ high and stays high even though the output of sense amplifier $A_1$ may go into an undefined state.

The output of AND gate $16_1$, as shown on line 108, also goes high. The gates Of $Q_3$ and $Q_4$, as shown on line 110, go low and the gates of $Q_1$ and $Q_2$, shown on line 112, go high.

The memory of FIG. 1 will, of course, have some delays in its operation. Timeline 104 shows that during a time $t_1$ after the read voltage is applied, sense amplifier $A_1$ will have an undefined output. In other words, it takes time $t_1$ for sense amplifier $A_1$ to respond. Once the need to invert polarity is indicated by the output of AND gate $16_1$, it takes time $t_2$ until the polarity of the voltage applied to ferroelectric capacitor $F_1$ changes.

Thus, during time $t_1$ plus $t_2$, ferroelectric capacitor $F_1$ is charging from a logic zero towards a logic one state. However, this time will be relatively short and the ferroelectric capacitor is still charged near a logic zero state. When the polarity of the voltage applied to ferroelectric cell $F_1$ is inverted, it only takes, at most, the short time $t_1$ plus $t_2$ to restore the ferroelectric cell $F_1$ to a logic zero state. Therefore, during the read operation, the value stored in a memory cell is disrupted for a maximum of $2(t_1+t_2)$.

If power is lost during this interval of time $2(t_1+t_2)$, the contents of memory will be lost. However, the length of this interval is on the order of 15 to 20 nanoseconds. In contrast, the prior art read cycle sensed during one cycle and restored during the next cycle. The length of one cycle is typically on the order of 200 to 400 nanoseconds, making an interval of 200 to 400 nanoseconds where information could be lost if power were lost during a read operation. The significantly shorter time during which information could be lost during a read operation provides a substantial advantage where the ferroelectric memory is used to store information which should not be lost if there is a sudden loss of power to the memory.

For completeness, FIG. 2 shows a read cycle 122 where a logic 1 is read from memory. Here, the output of sense amplifier $A_1$ never goes high and the values at the gates of transistors $Q_1$, $Q_2$, $Q_3$ and $Q_4$ never change.

Having disclosed one embodiment of the invention, various alternative embodiments will be apparent to one of skill in the art. For example, FIG. 1 discloses that each cell of the memory array contains circuitry to invert the polarity of the voltage applied to the ferroelectric cell. In an alternative embodiment, the switching means might be incorporated into the row and column drivers. In the disclosed embodiment, standard circuit elements were used throughout. Various substitutions could be made for the disclosed components. It is felt, therefore, that this invention should be limited only by the spirit and scope of the appended claims.

What is claimed is:

1. A memory cell comprising:
   a) means for storing a bit of information, said means having two terminals and said means being adapted to store information in response to an electrical signal applied between the two terminals;
   b) means for sensing the value of the bit of information in the storing means, said means comprising
      (i) means for applying a voltage of a first polarity to the storing means;
      (ii) means for producing an indication of the value of the bit at a time $t_1$ after the voltage is applied to the storing means; and
      (iii) means, responsive to the sensing means, for changing the polarity of the voltage applied to the storing means when the bit of information has a predetermined value, said means operating to change the polarity at the time $t_1$ after the voltage is applied by the sensing means.

2. The memory of claim 1 wherein the storing means comprises a ferroelectric cell having two terminals.

3. A memory cell having a first terminal and a second terminal comprising:
   a) means, comprising a ferroelectric cell having a first terminal and a second terminal, for storing a bit of information, said means being adapted to store information in response to an electrical signal applied between the two terminals; and
   b) means for changing the polarity of the electrical signal applied between the two terminals in response to the bit of information in the storing means, said means comprising:
      (i) a first transistor switch connected between the first terminal of the memory cell and the first terminal of the ferroelectric cell, said first transistor switch having a control electrode;
      (ii) a second transistor switch connected between the second terminal of the ferroelectric cell and the first terminal of the memory cell, said second transistor switch having a control electrode;
      (iii) a third transistor switch connected between the first terminal of the ferroelectric cell and the second terminal of the memory cell, said third transistor switch having a control electrode;
      (iv) a fourth transistor switch connected between the second terminal of the ferroelectric cell and the second terminal of the memory cell, said fourth transistor switch having a control electrode; and
      (v) means for providing control inputs to the control electrodes of the first, second, third and fourth transistor switches, said control inputs to the first and fourth transistor switches being in a first state while the control inputs to the second and third transistor switches are in a second state.

4. The memory cell of claim 3 wherein the means for providing control input comprises:
   a) a means for applying an electrical signal across the first and second terminals of the memory cell;
   b) a means for sensing the level of the current flow through the second terminal of the memory cell; and
   c) a means, responsive to the sensing means, for putting the control inputs to the first and fourth transistor switches in a first state when the sensing means indicates the level of the current flow through the second terminal has a first value and in a second state when the level of the current flow through the second terminal has a second value.

5. The memory cell of claim 4 wherein the first, second, third and fourth transistor switches conduct current when their control inputs are in the first state and are substantially non-conductive when their control inputs are in the second state.

6. The memory cell of claim 5 wherein the first value of current flow is substantially zero.

7. In a non-volatile memory of the type wherein information is read from a memory cell by applying an electrical signal across the cell and measuring the current flow into the cell, an improved method of reading the value in the cell comprising:
   a) applying the electrical signal to the cell;
   b) measuring the current flow; and
   c) in response to a current flow exceeding a predetermined level, substantially instantaneously inverting the polarity of the electrical signal applied to the cell.

8. The method of claim 7 wherein the memory is controlled in part by a clock having a predetermined period and the electrical signal is applied during one period and the polarity of the electrical signal is inverted during the same period.

9. The method of claim 7 wherein the polarity of the electrical signal is inverted in less than 30 nanoseconds.

10. A non-volatile memory comprising a plurality of cells connected to a grid of control lines, each cell comprising:
    a) a ferroelectric capacitor having a first terminal and a second terminal;
    b) a first transistor switch connecting the first terminal of the ferroelectric capacitor to a first control line, said first transistor switch having a second electrode;
    c) a second transistor switch connecting the second terminal of the ferroelectric capacitor to a second control line, said second transistor switch having a control electrode;
    d) a third transistor switch connecting the second terminal of the ferroelectric capacitor to a first control line, said third transistor switch having a control electrode; and
    e) a fourth transistor switch connecting the first terminal of the ferroelectric capacitor to a second control line, said fourth transistor switch having a control electrode.

11. The non-volatile memory of claim 10 wherein the control electrode of the first transistor is connected to the control electrode of the second transistor and the control electrode of the third transistor is connected to the control electrode of the fourth transistor.

12. The non-volatile memory of claim 11 additionally comprising a means for producing a logic signal indicating whether the level of current flowing in the second control line exceeds a predetermined threshold.

13. The non-volatile memory of claim 12 additionally comprising digital logic means for producing an output in a first state when the means for producing a logic signal indicates a level of current flow exceeding the threshold and for maintaining the output in the first state until receiving a control signal.

14. The non-volatile memory of claim 13 additionally comprising control logic means for producing a signal indicating when the memory is to perform a read operation.

15. The non-volatile memory of claim 14 additionally comprising a means for producing a digital signal having a value equaling the logical AND of the signal produced by the control logic means and the output of the digital logic means.

16. The non-volatile memory of claim 10 additionally comprising a plurality of voltage source means connected to the control lines for producing a voltage across a selected one of the plurality of cells, wherein the voltage sources are switchable to change the polarity of the voltage across the selected one of the plurality of cells.

17. The memory cell of claim 1 wherein the means for changing the polarity comprises a plurality of switching transistors.

* * * * *